United States Patent
Schammler et al.

(10) Patent No.: US 6,894,390 B2
(45) Date of Patent: May 17, 2005

(54) SOFT ERROR RESISTANT SEMICONDUCTOR DEVICE

(75) Inventors: Gisela Schammler, Dresden (DE); Mathias Böttcher, Dresden (DE); Frank Kuechenmeister, Dresden (DE); Daniel Gehre, Dresden (DE); Ehrenfried Zschech, Moritzburg (DE)

(73) Assignee: Advanced Micro Devices, Inc., Austin, TX (US)

(*) Notice: Subject to any disclaimer, the term of this patent is extended or adjusted under 35 U.S.C. 154(b) by 19 days.

(21) Appl. No.: 10/649,049

(22) Filed: Aug. 27, 2003

(65) Prior Publication Data

US 2004/0164409 A1 Aug. 26, 2004

(30) Foreign Application Priority Data

Feb. 26, 2003 (DE) .......................................... 103 08 275

(51) Int. Cl.[7] .............................................. H01L 23/48
(52) U.S. Cl. ...................... 257/738; 257/737; 257/779; 257/780
(58) Field of Search ................................. 257/737, 738, 257/736, 779, 780, 781, 733, 778

(56) References Cited

U.S. PATENT DOCUMENTS

| 5,990,564 | A | 11/1999 | Degani et al. | ............... 257/778 |
|---|---|---|---|---|
| 6,287,893 | B1 * | 9/2001 | Elenius et al. | ............... 438/108 |
| 2002/0074656 | A1 | 6/2002 | Ujiie et al. | ................... 257/738 |
| 2003/0119300 | A1 * | 6/2003 | Chiu et al. | ................... 438/615 |

FOREIGN PATENT DOCUMENTS

| DE | 198 42 441 A1 | 9/1999 | ........... H01L/27/12 |
|---|---|---|---|
| DE | 100 56 869 A1 | 6/2002 | ......... H01L/23/556 |
| JP | 11111885 A | 4/1999 | ........... H01L/23/12 |

\* cited by examiner

*Primary Examiner*—Hoai Pham
*Assistant Examiner*—Dilinh Nguyen
(74) *Attorney, Agent, or Firm*—Williams, Morgan & Amerson

(57) ABSTRACT

A semiconductor device comprises a material layer adapted to efficiently stop alpha particles that are substantially generated within a solder bump of a flip chip device. The materials used for stopping the alpha particles are compatible with standard back-end processing and do not degrade adhesion of the solder bump to the remaining substrate. Moreover, a low electrical resistance is maintained and heat dissipation may be improved.

21 Claims, 2 Drawing Sheets

SOFT ERROR RESISTANT SEMICONDUCTOR DEVICE

BACKGROUND OF THE INVENTION

1. Field of the Invention

The present invention relates to a semiconductor device that exhibits an increased resistance against radiation-induced malfunctions, and, more particularly, to a semiconductor device having a reduced penetration rate of alpha particles.

2. Description of the Related Art

Steadily decreasing feature sizes in modern integrated circuits allow fabrication of electronic devices exhibiting complex functionality within an extremely small volume. Accordingly, modern integrated circuits are increasingly used in all types of electronic devices as data processing units or as storage media, irrespective of whether the device is an everyday product, such as a personal computer, or a device employed in the medical, technical or scientific fields. Among this variety of possible applications of integrated circuits, certain critical applications, e.g., data processing units in vehicles, medical devices and the like, require extremely reliable semiconductor devices, such as chips with logic and/or memory function, to avoid serious malfunction of the semiconductor device and any peripheral devices connected thereto. Due to the ever decreasing feature sizes of modern integrated circuits, however, radiation-induced charge carrier generation in semiconductor devices increasingly proves to be a possible source of failure for the device, which accordingly decreases reliability, or even causes a complete failure, and thus restricts applicability of the device.

The issue of radiation-induced charge carrier generation becomes more exacerbated with decreasing supply voltage driving modern integrated circuits that are preferably used in portable devices. High energetic particles penetrating the semiconductor device may create a plurality of electron hole pairs, which may then enter charge-sensitive areas and cause device failures, and/or may accumulate in charge-sensitive regions of the semiconductor device, for example in dielectrics of storage capacitors or in gate insulation layers of MOS transistors. In the latter case, a significant drift in the threshold voltage of the transistor device may be created, whereas an accumulated charge in a storage capacitor may lead to a changed logic state of the capacitor, thereby causing an error in reading the storage contents, which is also referred to as soft error.

It has been found that a major source of radiation-induced charge carrier generation is the emission of alpha particles from materials of which the semiconductor devices are formed or which are used for assembly and packaging. In particular, semiconductor devices that are packaged by using a plurality of solder bumps may in general contain a large fraction of lead. Lead as usually used for standard solder materials contains the isotope $^{210}$Pb that undergoes a β decay and forms an unstable $^{210}$Bi isotope and a Po isotope, which then decay into a stable $^{206}$Pb, thereby emitting alpha particles with an energy of about 5.4 MeV. Alpha particles that are moving upon decay of a lead isotope 210 in the direction of charge-sensitive areas of the semiconductor device create an especially large amount of additional charge carriers due to the large absorption cross-section of alpha particles in matter.

U.S. Pat. No. 5,965,945 addresses the problem of alpha particles inherently created by the decay of $^{210}$Pb isotopes contained in the solder bumps and proposes an improved solder bump composition in which a thin low alpha layer of lead is deposited over alpha particle sensitive devices, while ordinary, i.e., low cost, lead is used for the bulk of the solder bump. Although this approach allows effective absorption of alpha particles emitted by the low cost lead, the provision of low alpha lead is costly and it is difficult during the reflowing of the solder bump for forming a solder ball to avoid mixing of the low alpha lead and the low cost lead.

U.S. Pat. No. 6,043,429 discloses a flip chip and a flip chip package that are shielded from alpha particles in that the solder bumps are coated with a layer of alpha particle absorbing material or in that a suitable amount of alpha particle absorbing material is provided in the underfill material between the flip chip and the package substrate. In this arrangement, the penetration of alpha particles is significantly reduced, wherein, however, the penetration of alpha particles, inherently created by the decay of alpha active isotopes that are moving directly from the solder bump into the underlying device regions, may not be stopped efficiently.

With reference to FIG. 1, the problem of penetration of high energy particles into charge-carrier sensitive regions will now be discussed in more detail, wherein a typical prior art semiconductor device including, for instance, MOS transistors or storage capacitors, is described.

In FIG. 1, a semiconductor device 100 comprises a substrate 101 that includes one or more functional elements (not shown) that are sensitive for radiation-induced charge carriers. A contact pad 102 is formed over the substrate 101 and is usually in electrical contact with the functional element. The contact pad 102 is electrically insulated by a first insulating layer 103 and a second insulating layer 104. On the contact pad 102 and partially on the second insulating layer 104, a metal or metal compound layer, also referred to as underbump metallization 105, is formed and separates a solder ball 106 comprising a substantial amount of lead from the underlying material layers.

Process flows for forming the semiconductor 100 are well known in the art and a detailed description thereof is omitted. It should be noted, however, that the solder ball 106 is formed of a solder bump that may be deposited over the underbump metallization 105 and partially over the second insulating layer 104 by means of electroplating or any other appropriate deposition method using a mask to adequately dimension the solder bump. After removal of the mask, the solder bump is reflowed to form the solder ball 106 which substantially recedes onto the underbump metallization 105 due to surface tension. The underbump metallization 105 substantially serves two purposes. First, the underbump metallization 105 is provided to substantially prevent diffusion of solder material into the underlying regions of the semiconductor device 100. Second, the underbump metallization 105 has to provide sufficient adhesion to the materials over and under the underbump metallization to establish a required mechanical stability and to guarantee the required reliability.

During usage of the semiconductor device 100, unstable lead isotopes, such as the isotope $^{210}$Pb, may decay and, as a result of this decay, alpha particles may be generated. As an example, in FIG. 1, one branch of the decay of the $^{210}$Pb isotope is depicted. If the alpha particles are generated sufficiently close to the interface of the underlying material layers, such as the underbump metallization 105, the alpha particle may also penetrate the substrate 101 and create a plurality of electron hole pairs until the alpha particle is finally stopped. As previously explained, a fraction of these additionally created charge carriers may enter charge-sensitive areas, such as junctions between inversely doped regions, or thin dielectric layers separating electrically active regions. Consequently, this additional charge may cause a significant shift of the operating conditions, especially when the feature sizes are small and the corresponding operating voltages are low.

In view of the problems outlined above, there is a need for an improved semiconductor device in which penetration of high-energy particles, especially alpha particles, is significantly reduced.

SUMMARY OF THE INVENTION

To reduce radiation induced charge-carrier generation, the present invention provides, according to one embodiment, a semiconductor device comprising a substrate including a contact pad and a solder bump formed on the contact pad. Moreover, an absorption layer is disposed between the contact pad and the solder bump, wherein a thickness of the absorption layer is configured to substantially completely stop alpha particles of at least 5.4 MeV.

According to a further embodiment of the present invention, a semiconductor device comprises a substrate including a contact pad and a solder bump formed on the contact pad. An underbump metallization is disposed between the contact pad and the solder bump, wherein the underbump metallization substantially prevents diffusion of solder bump material into the substrate and provides adhesion of the solder bump to the substrate. The underbump metallization has a thickness that is sufficient to stop alpha particles having an energy of approximately 5.4 MeV.

According to another embodiment of the present invention, a semiconductor device comprises a substrate including a functional element and a multilayer metal stack formed over the substrate, wherein the multilayer metal stack has an intrinsic alpha particle emission rate of less than 0.001 alpha particles/cm$^2$ an hour and a thickness of 1 $\mu$m and more depending on the type of material. The semiconductor device further comprises a solder bump formed on the multilayer metal stack.

According to a further illustrative embodiment of the present invention, a method of forming a soft error reduced semiconductor device comprises providing a substrate having formed thereon a circuit element and forming a contact pad over the substrate. Then, an electrically conductive absorption layer is formed over the contact pad with a predefined thickness allowing the stoppage of alpha particles with an energy of approximately 5.4 MeV. Finally a solder bump is formed over the absorption layer.

BRIEF DESCRIPTION OF THE DRAWINGS

The invention may be understood by reference to the following description taken in conjunction with the accompanying drawings, in which like reference numerals identify like elements, and in which.

Figure 1:
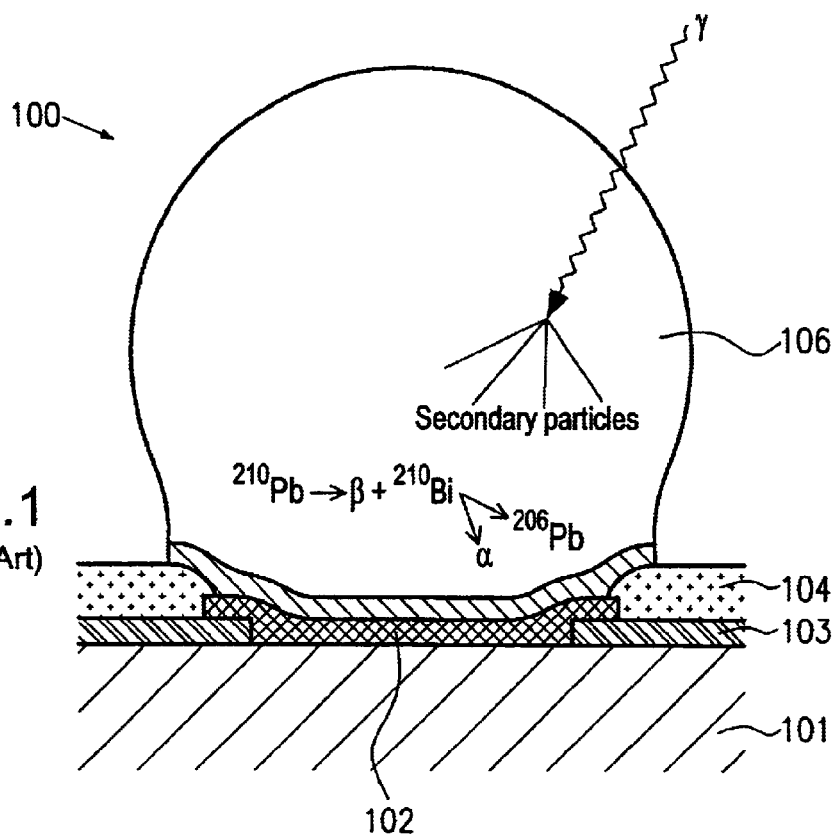
FIG. 1 schematically shows a cross-sectional view of a typical prior art semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention provides a semiconductor device in which an additional absorption layer is included to significantly reduce penetration of high-energy particles, especially of alpha particles, that may inherently be generated in a solder bump by decay of radioactive isotopes and/or by materials used for assembling and packaging the semiconductor device. The thickness of the absorption layer is selected such that at least alpha particles of an energy of 5.4 MeV, mainly generated by lead containing materials, are substantially completely stopped within the absorption layer to substantially prevent the particles from reaching gate or capacitor dielectrics or charge sensitive regions, even if the alpha particle is generated close to the surface of the absorption layer and its direction of movement is substantially perpendicular to the surface of the absorption layer. That is, the thickness of the absorption layer is sufficient to stop alpha particles exhibiting a minimum migration length within the solder bump, without compromising adhesion of the solder bump to the underlying material layers and barrier quality for substantially preventing diffusion of solder bump material into underlying device regions. As is explained later, contrary to prior art approaches, formation of the absorption layer may be compatible with back end processing.

Figure 2:
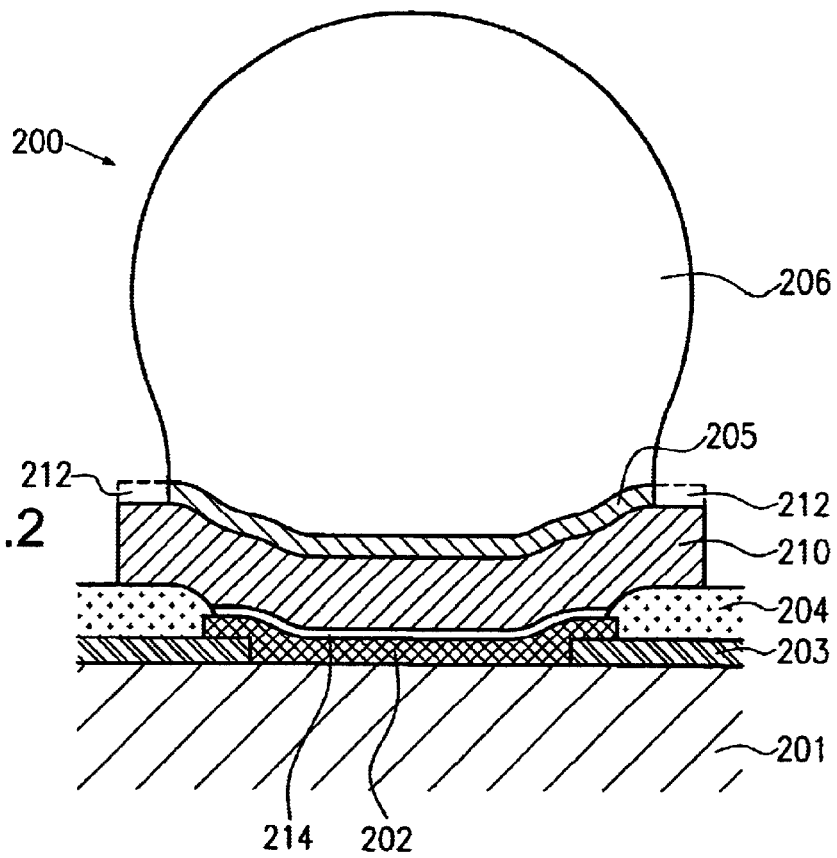
FIG. 2 shows a schematic cross-sectional view of a radiation resistant semiconductor device according to one embodiment of the present invention.

With reference to FIG. 2, an illustrative embodiment according to the present invention meeting the above-outlined requirements will now be described. FIG. 2 shows a schematic cross-sectional view of a semiconductor device 200 comprising a substrate 201 that includes a functional element (not shown) having charge carrier sensitive regions. A contact pad 202 formed over the substrate 201 and partially over a first insulating layer 203 may be electrically connected to the functional element. For simplicity, a corresponding electrical connection is not shown in FIG. 2. In other embodiments, the contact pad 202 may not be electrically connected to a functional element and may act as an additional contact pad for receiving a "dummy" solder bump that may improve the mechanical stability and/or the thermal conductivity and/or the stopping of high energy radiation, and the like. A second insulating layer 204 is formed over the first insulating layer 203 and partially over the contact pad 202. An absorption layer 210 is formed over the contact pad 202 and, according to the embodiment illustrated in FIG. 2, the absorption layer 210 covers a portion of the second insulating layer 204. The absorption layer 210 exhibits a minimum thickness that is sufficient to stop alpha particles having an energy of approximately at least 5.4 MeV, even in a case when the alpha particle is generated very closely to the absorption layer 210 and enters the same substantially perpendicularly to its surface. In one illustrative embodiment, the absorption layer 210 is substantially comprised of copper and has a minimum thickness of about 5 $\mu$m which is, according to experiments performed by the inventors, sufficient to stop alpha particles of 5.4 MeV.

In a further embodiment, the absorption layer 210 may comprise a barrier layer 214, for example a titanium tungsten layer, to avoid diffusion of atoms of the absorption layer 210 into the contact pad 202 and the second insulating layer 204. The barrier layer 214 may be especially advantageous when the absorption layer 210 comprises copper as copper readily diffuses in silicon dioxide and silicon. Other appropriate materials for the absorption layer 210 include nickel, chromium, tungsten, gold, silver, platinum, tantalum and any compounds of these materials. Other electrically conductive materials may also be used as long as the effective thickness is sufficient to stop alpha particles of an energy of at least approximately 5.4 MeV. The minimum thickness of the absorption layer 210 depends on the type of material used owing to different absorption cross-sections for alpha particles of these materials. An appropriate thickness for all of the above materials ranges from approximately 1–10 $\mu$m, wherein, for heavier elements such as tungsten, gold, silver, platinum, tantalum and compounds thereof, a thickness from approximately 1–4 $\mu$m may be appropriate to achieve the required effect. In one embodiment, a multi-layer stack may be provided, wherein the absorption layer 210 and/or the barrier layer 214 may comprise one or more sub-layers. The multi-layer metal stack may be configured to have an intrinsic alpha particle emission rate of less than 0.001 alpha particles/cm$^2$ an hour and a thickness of 1 $\mu$m and more depending on the type of material used.

Over the absorption layer 210, an underbump metallization 205 is formed on top of which a solder ball 206 is located. The underbump metallization 205 may comprise a plurality of metal layers, such as chromium/copper, copper, titanium/tungsten and others. As previously explained, the composition of the underbump metallization 205 is selected to provide sufficient adhesion of the solder ball 206 to the underlying substrate 201 and to substantially prevent diffusion of atoms of the solder ball 206 into the underlying regions. Moreover, the composition and the thickness of individual layers of the underbump metallization 205 may be selected to substantially balance any mechanical stress created by heating the substrate 201.

During usage of the semiconductor device 200, alpha particles arising from the decay of unstable lead isotopes and other unstable heavy atoms will, when moving in the general direction of the absorption layer 210, be absorbed within the absorption layer 210 even in the case when alpha particles are created at the interface to the underbump metallization 205 and move substantially perpendicularly to the surface of the absorption layer 210. Upon stopping the alpha particles, a large amount of atoms within the absorption layer 210 is ionized and, depending on the operating conditions, the charge carriers created by ionizing metal atoms may drift away when the solder ball is in contact with an external power supply, or the additional charge carriers may be recaptured after a certain relaxation time. Alpha particles that are emitted at a perimeter portion of the solder ball 206 and that are directed in a generally horizontal direction with respect to the configuration shown in FIG. 2 will substantially be prevented from reaching the functional element within the substrate 201, since these particles have to move a relatively long distance through an underfill material (not shown) and will then impinge on the second insulating layer 204 under a small angle. Consequently, the effective path length an alpha particle has to move within the underfill material and the second insulating layer 204 and the first insulating layer 203 is quite large, which significantly reduces the probability of the alpha particle for reaching the substrate 201.

According to a further embodiment, as will be described with reference to FIGS. 3a–3b, the lateral extension of the absorption layer 210 may significantly extend beyond the lateral dimensions of the solder ball 206 to absorb alpha particles that are emitted under a wide range of angles.

A typical process flow for forming the semiconductor device 200 may include the following process steps. After forming the contact pad 202, which may substantially be comprised of aluminum or, in high-performance devices, may substantially be comprised of copper or any alloys thereof, on the substrate 201 and partially on the first insulating layer 203, which may be comprised of silicon dioxide or silicon nitride, the second insulating layer 204, for example silicon dioxide or silicon nitride, is deposited and patterned by well-known techniques. Subsequently, a relatively thick metal-containing layer, i.e., on the order of some $\mu$m depending on the type of material, may be deposited by, for example, physical vapor deposition, electroplating and the like. For example, if a copper absorption layer is formed, preferably the thin barrier layer 214 comprising, for example tantalum, tantalum nitride, titanium, titanium nitride, and the like, may be deposited followed by a seed layer (not shown) formed by sputter deposition prior to forming the thick copper layer by means of electroplating. During depositing of the bulk material of the absorption layer 214, process parameters, such as deposition time, deposition rate and the like, are controlled to obtain a final thickness of the absorption layer 214 that ensures the required stopping power. Typically, a thickness of approximately 1–10 $\mu$m is appropriate for a wide variety of suitable materials, wherein, for example, approximately 1–4 $\mu$m may be selected for heavy elements, such as tungsten, gold, silver, platinum, tantalum, and approximately 5 μm and more for copper, nickel and the like. It is to be noted that the above values may have to be adapted accordingly when the above materials are used in compounds including components having a less effective stopping power than the pure materials specified above. Subsequently, the underbump metallization 205 is formed on the absorption layer 210 and a photoresist mask is formed thereon to define an opening in which solder bump material is to be filled in. Thereafter, solder bump material is filled in the opening by an appropriate deposition method, such as chemical vapor deposition, to form a solder bump. After removing the photoresist mask, the absorption layer 214 may be patterned so as to have a lateral extension that may coincide with the lateral extension of the solder bump, or that may exceed the lateral extension of the solder bump. Prior to patterning the absorption layer 210, the underbump metallization 205 may be selectively etched, wherein the degree of underetch of the solder bump may define the final lateral extension of the solder ball 206 that is created by reflowing the solder bump. Moreover, after forming the solder ball 206, the exposed surface portions of the absorption layer 210 may be coated by an appropriate passivation layer as is indicated by the peripheral portions 212, shown as dashed lines in FIG. 2.

Figure 3A:
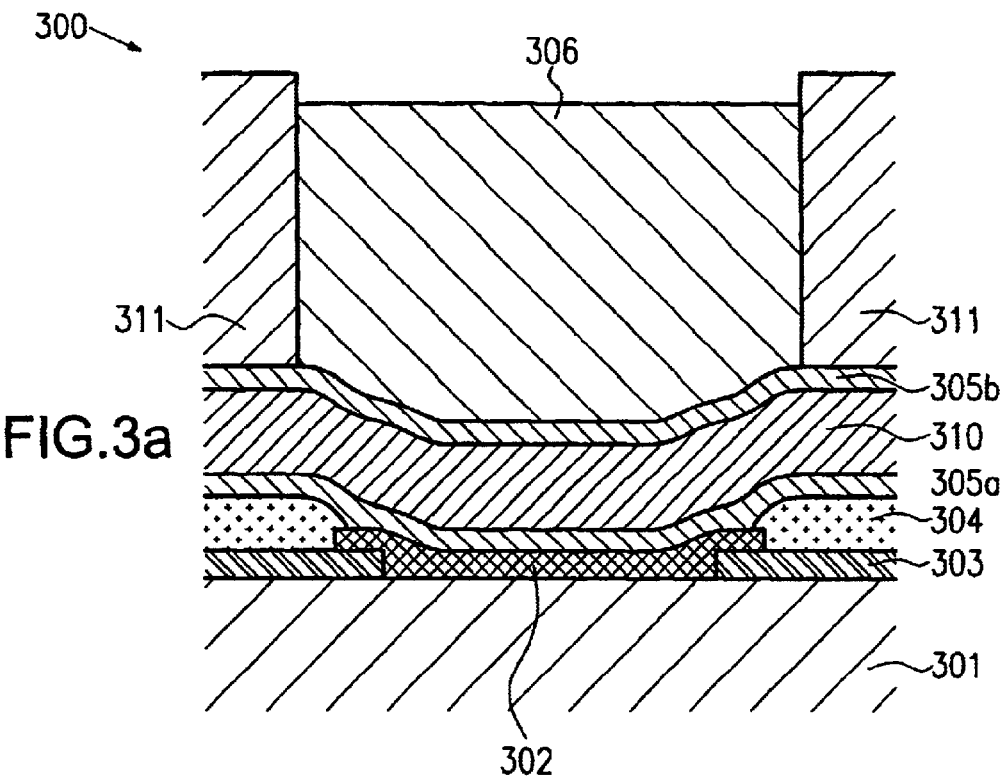
FIGS. 3a and 3b show schematic cross-sectional views of a radiation resistant semiconductor device during certain stages of manufacture.
Figure 3B:
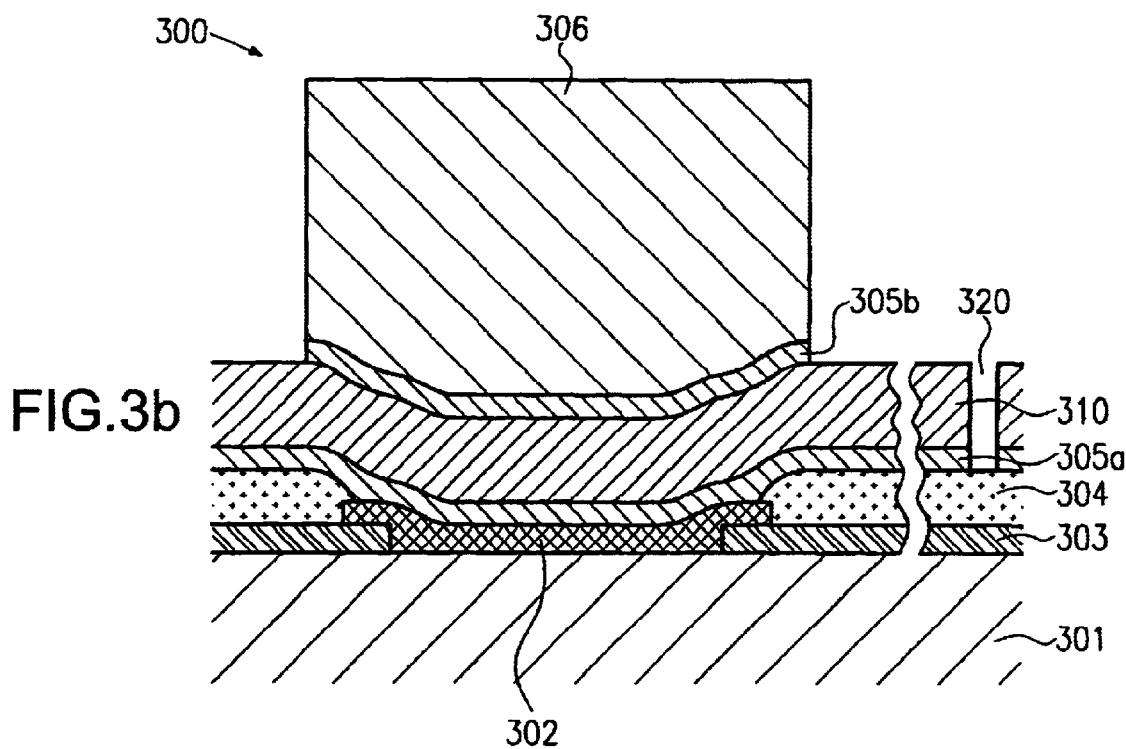

With reference to FIGS. 3a–3b, a further embodiment of the present invention will be described. FIGS. 3a–3b show schematic cross-sectional views of forming a semiconductor device 300 having, in its completed form, a similar configuration as the semiconductor device 200.

In FIG. 3a, the semiconductor device 300 is depicted in a manufacturing stage, wherein a semiconductor substrate 301 including a functional element (not shown) has a first insulating layer 303 formed thereon and a contact pad 302. A second insulating layer 304 is formed over the first insulating layer 303 and partially over the contact pad 302. A first underbump metallization layer 305a followed by an absorption layer 310 and a second underbump metallization layer 305b are formed over the substrate 301. A photoresist mask 311 defines an opening in which a solder bump material 306 is filled.

According to this embodiment, the contact pad 302 and the first and second insulating layer 303 and 304 are formed according to photolithography and etch techniques that are well known in the art. Subsequently, the first underbump metallization layer 305a, for example a titanium tungsten layer, is formed by means of CVD or sputter deposition. Thereafter, the absorption layer 310 is deposited with a predefined thickness, for example by physical vapor deposition or electroplating, wherein the first underbump metallization layer 305a acts as a current distribution layer. Subsequently, the second underbump metallization layer 305b is formed on the absorption layer 310, for example by physical vapor deposition. The first and second underbump metallization layers 305a and 305b and the absorption layer 310 may be considered as a underbump metal stack, the total thickness of which is selected to provide the required alpha particle stopping characteristics. After forming the photoresist mask 311 by known photolithography and etching techniques, the solder bump material 306 may be deposited by electroplating, wherein the first underbump metallization layer 305a, the absorption layer 310 and the second underbump metallization layer 305b serve as a current distribution layer. Due to the relatively large thickness of the absorption layer 310, for example about 5 μm for a copper layer, a uniform current distribution over the entire substrate area is obtained to thereby deposit uniform amounts of solder bump material 306 within the photoresist mask 311, even if a large-area substrate 301 is used that bears a large number of openings to be filled with the solder material 306. Moreover, the large thickness of the absorption layer 310 allows relatively high currents in electroplating the bump material, thereby generating an increased deposition rate.

FIG. 3b depicts the semiconductor device 300 in an advanced manufacturing stage. In FIG. 3b, the photoresist mask 311 is removed and the second underbump metallization layer 305b may be patterned to exhibit the lateral extension of the solder bump 306. In other embodiments, the second metallization layer 305b may be patterned together with the absorption layer 310. Moreover, the absorption layer 310 and the first underbump metallization layer 305a are patterned to laterally extend beyond the solder bump 306 to an amount that is in conformity with design requirements. In one particular embodiment, the absorption layer 310 and the first underbump metallization layer 305a are patterned to substantially cover the entire substrate surface, to separate adjacent solder bumps by narrow trenches 320 having a width on the order of 1–100 μm. It should be noted that, as previously explained, any amount of lateral extension may be selected. Moreover, as already described above, the exposed surface of the absorption layer 310 may be coated by an appropriate passivation layer, for example silicon nitride, to avoid any chemical reactions or out-diffusion of the absorption layer 310. Subsequently, the solder bump 306 may be reflowed to form a solder ball similar to that shown in FIG. 2.

As a result, the present invention provides a semiconductor device exhibiting an increased resistance against radiation-induced charge carrier creation, which may particularly be caused by alpha particles generated within solder bumps. Therefore, an interaction of these additionally created charge carriers in gate and/or capacitor dielectrics and charge carrier sensitive regions may significantly be reduced. The materials used for an effective absorption layer, such as copper, nickel, tungsten, gold, silver, platinum, tantalum and other metals, or any compounds thereof, may at least partially be compatible with standard semiconductor processing and also guarantee good adhesion and low electrical resistance. Moreover, by providing a corresponding absorption layer between the solder bump and the substrate, a more effective heat transport mechanism is established and thus heat dissipation of the device is significantly improved compared to conventional devices. Additionally, the composition of the absorption layer may be selected so as to effectively balance any thermal strain induced by heating the substrate, either during further manufacturing processes or during operation.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a substrate including a contact pad;
   a solder bump formed on said contact pad;
   a first absorption layer disposed between said contact pad and said solder bump, said first absorption layer having a thickness that is configured to substantially stop alpha particles of at least 5.4 MeV; and a second solder bump formed over a second absorption layer, wherein said first absorption layer and said second absorption layer are laterally isolated from each other by a spacing of approximately 1–100 µm.

2. The semiconductor device of claim 1, wherein each of said first and second absorption layers comprises at least one of copper, nickel, chromium, tungsten, gold, silver, platinum, tantalum and a compound thereof.

3. The semiconductor device of claim 1, wherein each of said first and second absorption layers comprises two or more sub-layers.

4. The semiconductor device of claim 1, wherein each of said first and second absorption layers is adapted to reduce passage of alpha particles to a rate less than 0.001 alpha particles/cm$^2$ an hour.

5. The semiconductor device of claim 1, wherein each of said first and second absorption layers laterally extends beyond said solder bump.

6. The semiconductor device of claim 4, further comprising a passivation layer covering a peripheral portion of each of said first and second absorption layers.

7. The semiconductor device of claim 1, wherein said spacing is filled with a dielectric material.

8. The semiconductor device of claim 1, wherein a thickness of each of said first and second absorption layers is in the range of approximately 1–10 µm.

9. The semiconductor device of claim 1, wherein an intrinsic alpha particle emission rate of each of said first and second absorption layers is less than 0.001 alpha particles/cm$^2$ an hour.

10. A semiconductor device, comprising:

a substrate including a plurality of contact pads;

a plurality of solder bumps, each of said solder bums formed on one of said plurality of contact pads; and a plurality of underbump metallization layers, each of said underbump metallization layers substantially preventing diffusion of solder bump material into said substrate and providing adhesion of each of said solder bumps to said substrate, wherein each of said underbump metallization layers has a thickness sufficient to stop alpha particles of approximately 5.4 MeV and adjacent underbump metallization layers being laterally isolated from each other by a spacing of 1–100 µm.

11. The semiconductor device of claim 10, wherein an intrinsic alpha particle emission rate of each of said underbump metallization layers is less an 0.001 alpha particles/cm$^2$ an hour.

12. The semiconductor device of claim 10, wherein a thickness of each of said underbump metallization layers is in the range of approximately 1–10 µm.

13. The semiconductor device of claim 10, wherein each of said underbump metallization layers comprises an absorption layer having a thickness of approximately 1 µm or more.

14. The semiconductor device of claim 13, wherein said absorption layer comprises at least one of copper, nickel, tungsten, gold, silver, platinum tantalum, and any compound thereof.

15. The semiconductor device of claim 13, wherein a thickness of said absorption layer is in the range of approximately 1–10 µm.

16. The semiconductor device of claim 10, wherein a lateral extension of each of said underbump metalization layers is larger than a lateral extension of said solder bump.

17. The semiconductor device of claim 10, wherein a peripheral portion of each of said underbump metallization layers is coated with a passivation layer.

18. A semiconductor device, comprising:

a substrate including a functional element;

a first and a second multilayer meal stack formed over said substrate, wherein each of said first and second multilayer metal tacks has an intrinsic alpha particle emission rate of less than 0.001 alpha particles/cm$^2$ an hour and a thickness of 1 µm and more; and a first and a second solder bump formed on said first and second multilayer metal stacks, respectively, such that said first and second multilayer stacks are laterally isolated from each other by a spacing of 1–100 µm.

19. The semiconductor device of claim 18, wherein each of said first and second multilayer metal stacks laterally extends beyond said respective solder bump.

20. The semiconductor device of claim 18, further comprising a passivation layer covering a peripheral portion of each of said multilayer metal stacks.

21. The semiconductor device of claim 18, wherein each of said first and second multilayer metal stacks comprises at least one of copper, nickel, tungsten, gold, silver, platinum, tantalum and any compound thereof.

* * * * *

UNITED STATES PATENT AND TRADEMARK OFFICE
CERTIFICATE OF CORRECTION

PATENT NO. : 6,894,390 B2
DATED : May 17, 2005
INVENTOR(S) : Gisela Schammler et al.

It is certified that error appears in the above-identified patent and that said Letters Patent is hereby corrected as shown below:

Column 10,
Line 3, change "less an" to -- less than --.
Line 26, change "meal" to -- metal --.
Line 28, change "tacks" to -- stacks --.

Signed and Sealed this

Twelfth Day of July, 2005

JON W. DUDAS
*Director of the United States Patent and Trademark Office*